United States Patent [19]
Carlin et al.

[11] Patent Number: 5,633,896
[45] Date of Patent: May 27, 1997

[54] AM COMPATIBLE DIGITAL WAVEFORM DEMODULATION USING A DUAL FFT

[75] Inventors: Barry W. Carlin; Mark J. Dapper, both of Cincinnati; Michael J. Geile, Loveland, all of Ohio

[73] Assignee: USA Digital Radio Partners, L.P., Linthicum, Md.

[21] Appl. No.: 604,276

[22] Filed: Feb. 21, 1996

Related U.S. Application Data

[60] Provisional application No. 60/003,018 Aug. 31, 1995.
[51] Int. Cl.⁶ .............................. H04L 27/06; H03D 1/00
[52] U.S. Cl. ........................ 375/340; 375/324; 370/206; 370/480
[58] Field of Search ................................ 385/340, 316, 385/322, 324, 325, 260, 261, 271; 455/142, 143, 205; 370/69.1, 121, 123, 19, 20, 21

[56] References Cited

U.S. PATENT DOCUMENTS 5,278,826  1/1994  Murphy et al. ................ 370/69.1
5,499,271  3/1996  Plenge et al. ................ 375/295

*Primary Examiner*—Stephen Chin
*Assistant Examiner*—Hai H. Phan
*Attorney, Agent, or Firm*—Townsend and Townsend and Crew LLP

[57] ABSTRACT

The invention provides a method and apparatus for demodulating a composite AM DAB waveform which contains digitally modulated carriers and which employ (1) a mixer for converting a received signal into two signals (the first of these two signals represents an in-phase component and the second of these two signals represents a quadrature component); (2) two analog-to-digital converters for converting the two signals into digital signals; and (3) two fast Fourier transform elements for extracting data separately from the two digital signals. Complementary digital carrier signals are recovered from the quadrature component, and non-complementary digital carriers are derived from a sum of the complementary data and the output of the in-phase component FFT process. Leakage of the AM signal through a highpass filter is prevented from interfering with the demodulation of the complementary carrier signals' use of separated demodulation channels.

12 Claims, 3 Drawing Sheets

AM COMPATIBLE DIGITAL WAVEFORM DEMODULATION USING A DUAL FFT

STATEMENT OF RELATED APPLICATIONS

This invention claims priority from a provisional application, U.S. Provisional application Ser. No. 60/003,018, filed Aug. 31, 1995.

BACKGROUND OF THE INVENTION

This invention relates to waveform demodulation, and more particularly to methods of and apparatus for receiving and demodulating digitally modulated signals and analog amplitude modulated signals within the same frequency channel assignment.

Broadcast and reception of digitally-encoded audio signals is expected to provide improved audio fidelity. Several approaches have been suggested. Out-of-band techniques provide broadcast of digital radio signals in a specially designated frequency band. In-band techniques provide broadcast within substantially vacant slots between adjacent channels in the existing broadcast band (interstitial approach) or in under-utilized portions within the same frequency channel allocations currently used by commercial broadcasters (in-band on-channel or IBOC approach). The in-band on-channel approach may be implemented without the need for additional frequency coordination and with relatively minor changes to existing transmitting equipment. It is also a requirement that any digital audio broadcasting (DAB) technique must not degrade analog signal reception by conventional analog receivers.

In-band approaches to digital audio broadcasting have thus far only been proposed in the FM band (88 MHz to 108 MHz), since the bandwidth of AM channels is relatively narrow as compared to the FM band allocation. However, high fidelity digital audio broadcasting in the AM band (530 kHz to 1700 kHz) would provide AM broadcasting stations with a means to compete with high-quality, portable audio sources such as cassette tapes and compact disc players. It would therefore be desirable to promote an in-band on-channel (IBOC) approach in the AM broadcasting band to provide enhanced fidelity through digital signalling without affecting reception by existing analog AM receivers.

An AM compatible digital broadcast waveform which satisfies the requirement of substantial orthogonality between a conventional analog AM signal and a digitally modulated signal set has been developed. The waveform is described in U.S. Pat. application Ser. No. 08/206,368 filed Mar. 7, 1994, entitled METHOD AND APPARATUS FOR AM COMPATIBLE DIGITAL BROADCASTING. The waveform spectrum consists of in-phase and quadrature components. An in-phase radio frequency (RF) carrier is modulated by an analog audio signal and the in-phase component of a digital signal. The quadrature-phase RF carrier is modulated by the quadrature component of the digital signal. The digital signal has an orthogonal frequency division multiplexed (OFDM) format. The in-phase signal consists of the conventional analog AM signal and selected digital carriers. The in-phase digital carriers are placed outside of the spectral region occupied by the analog AM signal. The quadrature-phase carriers are situated both within and outside the spectral region occupied by the analog AM signal (although not at the center frequency occupied by the unmodulated analog carrier). The quadrature digital carriers situated within the same spectral region as the analog AM signal are called complementary carriers. The above described arrangement is further described in U.S. Pat. application Ser. No. 08/368,061 filed Jan. 3, 1995, entitled METHOD AND APPARATUS FOR IMPROVING AM COMPATIBLE DIGITAL BROADCAST ANALOG FIDELITY.

The context of the present invention is a need to demodulate the composite waveform with minimal crosstalk. The modulated composite waveform is produced by a modulation method in which an analog amplitude modulated (AM) signal and a digital signal which may be a representation of the analog audio signal (or it may be any other digital signal) are encoded together and transmitted simultaneously in the same frequency channel. This approach places some of the digital carriers in quadrature with the analog AM, thereby enabling the AM DAB data to be extracted and decoded with high fidelity and without crosstalk, assuming the receiver is capable of proper signal separation.

A receiver (which is not necessarily prior art) has been considered which converts the signal to baseband using conventional I and Q mixers, with the I channel signal being passed through a digital high pass filter to separate the digital signal from the analog signal, as hereinafter explained, a problem has been discovered related to crosstalk between the analog signal and the digital signal. In the receiver under consideration, the analog signal interferes with the demodulation of the complementary carriers if the demodulation of the I and Q component samples is carried out in a single common FFT processor. What is needed is a demodulation technique which minimizes the undesired crosstalk between the analog signal and the digital signals.

SUMMARY OF THE INVENTION

According to the invention, in an AM compatible digital audio broadcasting (AM DAB) system using an orthogonal frequency division multiplexed (OFDM) modulation format, a radio frequency receiving and demodulating method and apparatus employs dual fast Fourier transform processes on separate respective in-phase and quadrature-phase components of a received OFDM digital signal, the output of the quadrature channel being used to recover the complementary data, and the resultant processed component signals being summed to recover the non-complementary data.

The apparatus includes a mixer for converting a received signal into two signals, the first of the two signals representing an in-phase component and the second of the two signals representing a quadrature component; two analog-to-digital converters for converting the two signals into digital signals; and two fast Fourier transform processors for extracting data from the two signals.

The present invention provides better and higher resolution data extraction than heretofore known. Moreover, the invention can be useful in providing an in-band, on-channel (IBOC) solution to digital audio broadcasting (DAB) in the AM frequency band.

The advantages of the waveform of the present invention are that (1) the existing analog AM broadcast channels can be upgraded to digital without requiring a new FCC frequency allocation, (2) the AM broadcast stations can be upgraded to a digital broadcast format with only limited capital expenditure, (3) the composite waveform at appropriate digital power levels yields a coverage area that is essentially equivalent to the existing analog AM station, (4) the existing AM receivers can recover the analog portion of the composite signal without modification, and (5) interference between the digital signal and the analog signal is minimized.

A description of the AM DAB waveform involved is presented in U.S. Ser. No. 08/206,368, filed on Mar. 7, 1994, which is herein incorporated by reference.

A further understanding of the nature and advantages of the invention will become apparent by reference to the remaining portions of the specification and drawings.

BRIEF DESCRIPTION OF THE DRAWINGS

The invention will be more readily apparent to those skilled in the art by reference to the accompanying drawings wherein.

DETAILED DESCRIPTION OF SPECIFIC EMBODIMENTS

This invention provides a method of simultaneously receiving both an analog amplitude modulated signal and a digital signal on the same channel assignment as the existing analog AM broadcasting allocation.

Figure 1:
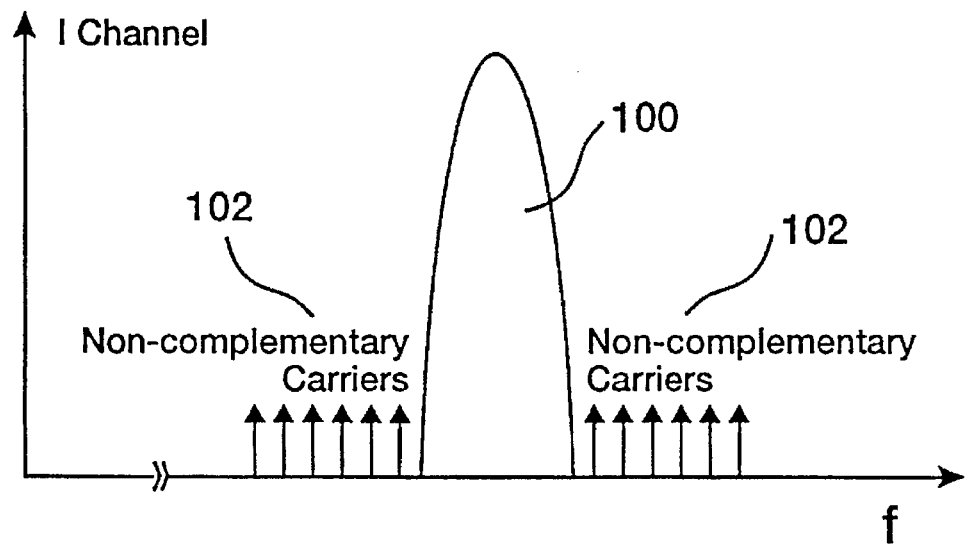
FIG. 1 is a spectral representation of the in-phase component of a composite analog AM and digital broadcasting signal.

The AM DAB waveform of the present invention has been previously explained. FIG. 1 is a spectral representation of the in-phase component of a composite analog AM and digital broadcasting signal. The in-phase component contains the conventional analog AM signal 100 and non-complementary digital carriers 102. The in-phase component does not have any digital carriers 102 in the spectral region occupied by the analog AM signal 100.

Figure 2:
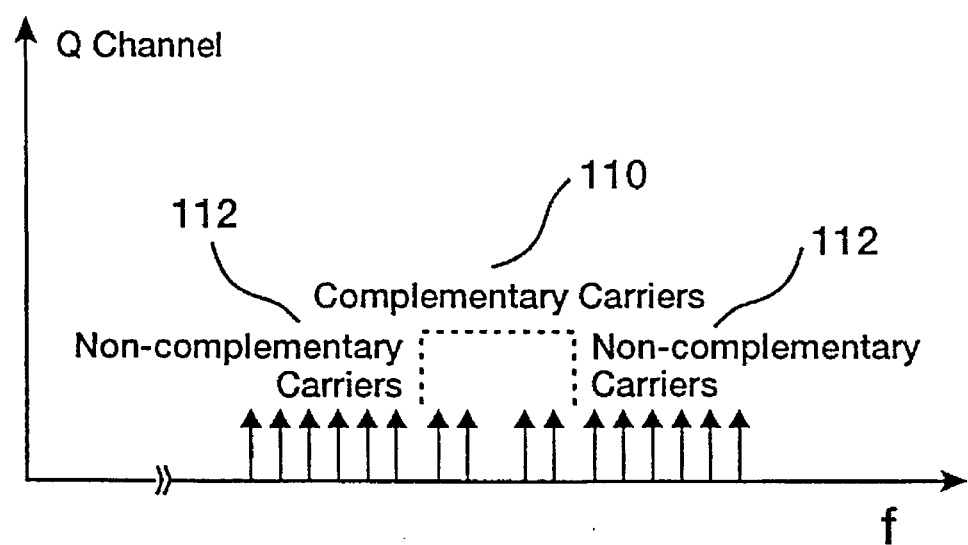
FIG. 2 is a spectral representation of the quadrature component of a digital broadcasting signal.

FIG. 2 is a spectral representation of the quadrature component of a digital broadcasting signal. The quadrature portion of the spectrum as shown in FIG. 2 contains only digital carriers 110 and 112. The digital carriers that lie outside the spectral region of the analog AM signal 100 are non-complementary signals 112, and the digital carriers that lie in the same frequency region as the analog AM signal 100 are complementary signals 110.

Figure 3:
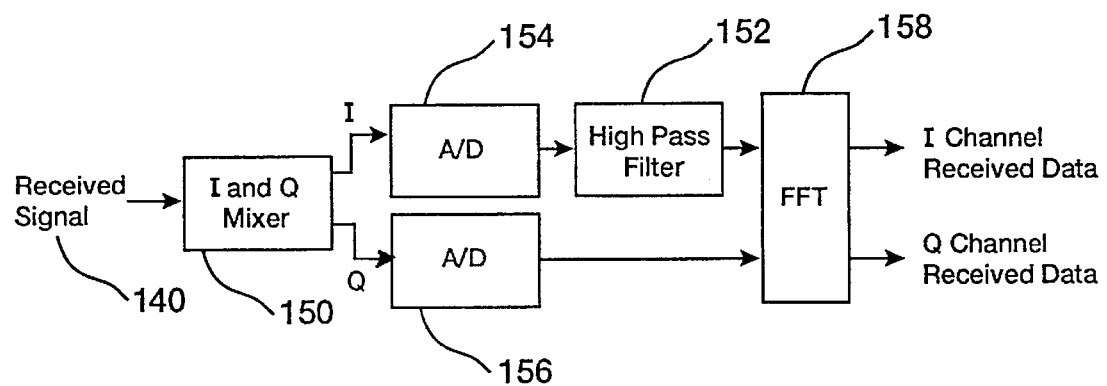
FIG. 3 is a block diagram of a demodulator which has been considered for the subject waveform.

FIG. 3 illustrates a demodulator which was considered in connection with the waveform herein described. The demodulation technique converts the signal 140 to baseband using conventional I and Q mixer 150. Mixer 150 separates the in-phase and quadrature components of the received signal. The I and Q channels are then digitized in analog-to-digital (A/D) converters 154 and 156. Following A/D converter 154, the I channel is passed through high pass filter 152 which is designed to eliminate the analog AM signal. The high pass filter 152 is in the real world less than ideal, which gives rise to some of the problems overcome by the present invention. The I and Q channels are then input to a fast Fourier transform (FFT) processor 158 in order to recover and obtain the received data.

While the device revealed in FIG. 3 will demodulate the signal involved, there is room for improvement. In particular, the receiver of FIG. 3 has several problems. For example, some of the analog AM signal leaks through highpass filter stopband 152 and interferes with the demodulation of the complementary carriers.

Figure 4:
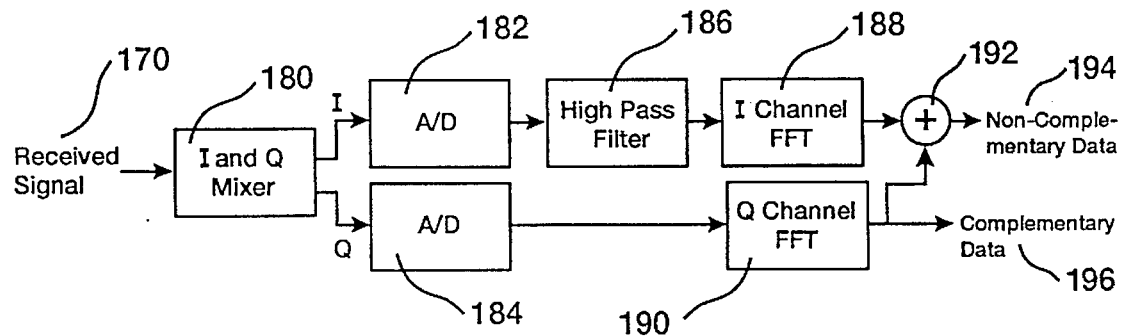
FIG. 4 is a block diagram of a demodulator in accordance with the present invention.

FIG. 4 illustrates how demodulation is performed in the present invention. This new demodulation technique avoids the problem of the demodulation technique illustrated in FIG. 3 by using two FFTs which operate separately on the I and Q channels. The received signal 170 is converted to baseband by conventional I and Q mixer 180. As with mixer 150, mixer 180 separates the in-phase and quadrature components of the received signal. The I and Q channels are then separately sent to A/D converters 182 and 184 where they are digitized. The I channel is passed through high pass filter 186 which attempts to eliminate the analog AM signal. The I and Q channels are then processed separately with dual FFT processors 188 and 190. The output from the Q channel is used to recover the complementary carriers, and the sum of the I and Q channels is used to recover the non-complementary carriers.

The demodulation technique illustrated in FIG. 4 stops leakage of the AM signal through the highpass filter from interfering with the demodulation of the complementary carriers. This technique also reduces the effects of noise and compensates for non-ideal operation of the I and Q mixer.

The demodulation techniques illustrated in FIG. 3 and FIG. 4 are implemented using common, commercially-available RF hardware, such as mixers and general purpose Digital Signal Processors (DSPs) with software to provide the various features of the demodulator (e.g., FFTs).

Figure 5:
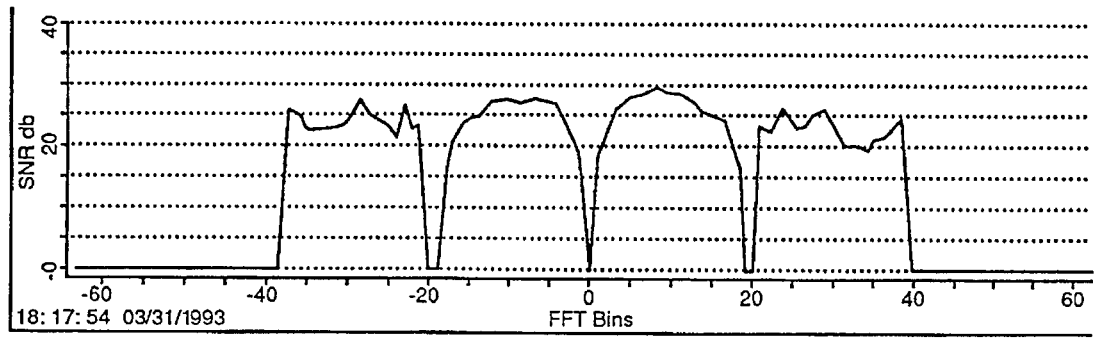
FIG. 5 is a representation of the signal-to-noise ratio (SNR) for carriers of the receiver shown in FIG. 3.

FIG. 5 shows the SNR for carriers when the receiver shown in FIG. 3 is used. The low SNR in FFT bins +16 to +19 and −19 to −16 causes the bit error rate to increase. The carriers in these FFT bins are near the edges of the complementary band, and the corresponding SNR is approximately 16 dB.

Figure 6:
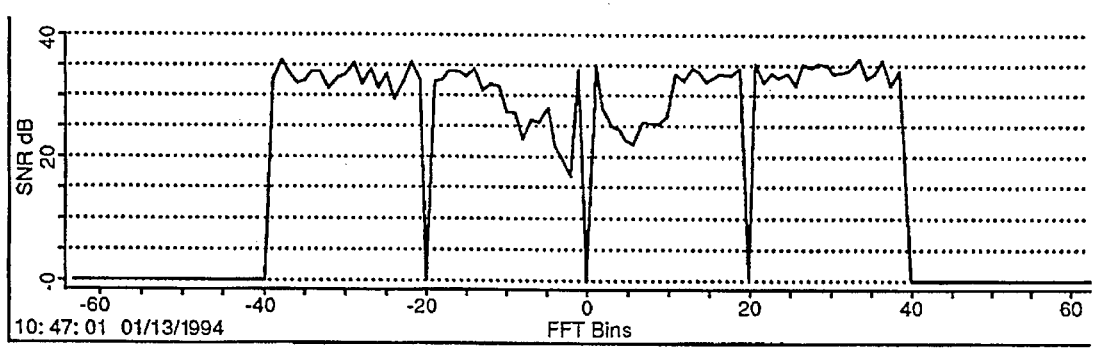
FIG. 6 is a representation of the signal-to-noise ratio (SNR) for carriers of the receiver in FIG. 4.

FIG. 6 is a plot of SNR for carriers when the demodulator illustrated in FIG. 4 is used. The SNR for the complementary carriers in FIG. 6 is approximately 33 dB. This is a significant improvement over the SNR for the complementary carriers for the demodulator illustrated in FIG. 3 and a lower bit error rate results. With the improved demodulator of FIG. 4, the signal can be received further away from the system's transmitter.

Although the foregoing invention has been described in some detail by way of illustration and example, for purposes of clarity of understanding, it will be obvious that certain changes and modifications may be practiced within the scope of the appended claims.

What is claimed is:

1. An apparatus for demodulating a composite signal, the composite signal including a first carrier signal amplitude modulated by an analog message signal and a second signal comprising a plurality of digitally modulated carriers, comprising:

means for separating the second signal into a third signal and a fourth signal, the third signal representing an in-phase component and the fourth signal representing a quadrature phase component of the composite signal;

first means coupled to receive the in-phase component for converting the in-phase component to an in-phase digital signal;

second means coupled to receive the quadrature component for converting the quadrature component to a quadrature digital signal;

a first fast Fourier transform means for extracting in-phase data from the in-phase digital signal; and a second fast Fourier transform means for extracting quadrature data from the quadrature digital signal.

2. The apparatus for demodulating according to claim 1, wherein the quadrature phase component comprises complementary carriers and non-complementary carriers.

3. The apparatus for demodulating according to claim 2, wherein the first carrier signal and the complementary carriers are located in a same frequency region.

4. The apparatus for demodulating according to claim 1, wherein the means for separating is a quadrature mixer.

5. The apparatus for demodulating according to claim 1, wherein the first means and the second means are analog-to-digital converters.

6. The apparatus for demodulating according to claim 1, further comprising:

means coupled to receive the in-phase data and the quadrature data, and for combining the in-phase data and the quadrature data to produce a fifth digital signal, the fifth digital signal being representative of non-complementary data.

7. The apparatus for demodulating according to claim 1, wherein the in-phase digital signal is phase coherent with the first carrier signal.

8. The apparatus for demodulating according to claim 1, wherein the composite signal is a radio frequency (RF) signal, and wherein the second signal comprising a plurality of digitally modulated carriers is modulated in an orthogonal frequency division multiplexed format.

9. A method of demodulating a composite signal, the composite signal including a first carrier signal amplitude modulated by an analog message signal and a second signal comprising a plurality of digitally modulated carriers, the method comprising the steps of:

receiving the composite signal;

separating the composite signal into a third signal and a fourth signal, the third signal representing an in-phase component and the fourth signal representing a quadrature phase component of the composite signal;

converting the in-phase component to an in-phase digital signal, the in-phase digital signal being phase coherent with the first carrier signal;

converting the quadrature component to a quadrature digital signal;

extracting in-phase data from the third signal by means of a first fast Fourier transform; and extracting quadrature data from the fourth signal by means of a second fast Fourier transform.

10. The method for demodulating a composite signal according to claim 9, wherein the quadrature data modulates complementary quadrature amplitude modulated carriers.

11. The method for demodulating a composite signal according to claim 9, further comprising:

combining the in-phase data and the quadrature data to produce a fifth signal, the fifth signal comprising non-complementary data.

12. The method for demodulating a composite signal according to claim 9, wherein the first fast Fourier transform and the second fast Fourier transform are performed substantially simultaneously.

* * * * *